(12) United States Patent
Lyford et al.

(10) Patent No.: US 12,348,178 B2
(45) Date of Patent: Jul. 1, 2025

(54) DEVICE FOR GENERATING ELECTRICITY

(71) Applicant: CLEARVUE TECHNOLOGIES LTD, West Perth (AU)

(72) Inventors: Jamie Lyford, West Perth (AU); Victor Rosenberg, West Perth (AU); Kim Harmer, West Perth (AU)

(73) Assignee: CLEARVUE TECHNOLOGIES LTD, West Perth (AU)

( * ) Notice: Subject to any disclaimer, the term of this patent is extended or adjusted under 35 U.S.C. 154(b) by 0 days.

(21) Appl. No.: 18/421,578

(22) Filed: Jan. 24, 2024

(65) Prior Publication Data

US 2024/0162850 A1    May 16, 2024

Related U.S. Application Data

(63) Continuation of application No. 17/259,390, filed as application No. PCT/AU2019/050677 on Jun. 27, 2019, now Pat. No. 11,996,798.

(30) Foreign Application Priority Data

Jul. 12, 2018    (AU) ................................ 2018902532

(51) Int. Cl.
*H02S 20/26* (2014.01)
*E06B 3/16* (2006.01)
(Continued)

(52) U.S. Cl.
CPC ............ *H02S 20/26* (2014.12); *E06B 3/6715* (2013.01); *E06B 7/28* (2013.01); *E06B 9/24* (2013.01);
(Continued)

(58) Field of Classification Search
CPC .... H01L 31/055; H02S 20/26; E04D 13/0315
See application file for complete search history.

(56) References Cited

U.S. PATENT DOCUMENTS

| 5,157,881 | A | 10/1992 | Tashman et al. |
| 2009/0032083 | A1 | 2/2009 | Torrance et al. |

(Continued)

FOREIGN PATENT DOCUMENTS

| DE | 10063815 A1 | 10/2001 |
| DE | 202008000678 U1 | 5/2009 |

(Continued)

OTHER PUBLICATIONS

International Report and Written Opinion mailed in International Patent Application No. PCT/AU2019/050677 mailed on Aug. 8, 2019 (9 pages).

*Primary Examiner* — Ryan S Cannon
(74) *Attorney, Agent, or Firm* — Michael Best & Friedrich LLP

(57) ABSTRACT

The present disclosure provides a device for generating electricity. The device includes first and third panels that are each at least partially transmissive for visible light and are spaced apart from each other. The first panel defines a light receiving surface. The device further includes first and second photovoltaic elements. The first photovoltaic element is arranged in a first orientation with respect to the light receiving surface and the second photovoltaic element being arranged in a second orientation that is different to both the orientation of the first photovoltaic element and the orientation of the light receiving surface. The first photovoltaic element and the second photovoltaic element are located within a projection of the circumference of the first panel in a direction along a surface normal of the first panel.

18 Claims, 5 Drawing Sheets

(51) Int. Cl.
  *E06B 3/67* (2006.01)
  *E06B 7/28* (2006.01)
  *E06B 9/24* (2006.01)
  *H02S 40/22* (2014.01)
  *H10F 77/42* (2025.01)
  *H10F 77/45* (2025.01)

(52) U.S. Cl.
  CPC ............ *H02S 40/22* (2014.12); *H10F 77/45* (2025.01); *H10F 77/488* (2025.01); *E06B 3/16* (2013.01); *E06B 2009/2417* (2013.01); *E06B 2009/2476* (2013.01)

(56) References Cited

U.S. PATENT DOCUMENTS

| | | |
|---|---|---|
| 2016/0204297 A1 | 7/2016 | Janowski |
| 2017/0170776 A1 | 6/2017 | Vasiliev et al. |
| 2018/0342638 A1 | 11/2018 | Lambricht et al. |
| 2021/0280727 A1 | 9/2021 | Jung et al. |

FOREIGN PATENT DOCUMENTS

| | | |
|---|---|---|
| EP | 2747275 A2 | 6/2014 |
| EP | 3348737 A1 | 7/2018 |
| WO | 2013003890 A1 | 1/2013 |
| WO | 2013003894 A1 | 1/2013 |
| WO | 2014178471 A1 | 11/2014 |
| WO | 2015024046 A1 | 2/2015 |

DEVICE FOR GENERATING ELECTRICITY

CROSS-REFERENCE TO RELATED APPLICATIONS

This application is a continuation of U.S. patent application Ser. No. 17/259,390, filed Jan. 11, 2021, which is the national phase of PCT/AU2019/050677, which claims priority to Australian Patent Application No. 2018902532. The foregoing applications are incorporated herein by reference.

TECHNICAL FIELD

The present disclosure related to a device for generating electric energy and relates particularly, though not exclusively, to a device comprising a photovoltaic element.

BACKGROUND

Overheating of interior spaces, such as spaces that receive sunlight through large windows, is a problem that may be overcome using air conditioners. A large amount of energy is globally used to cool interior spaces. The majority of electrical energy is generated using non-sustainable sources, which is of increasing environmental concern.

PCT international applications numbers PCT/AU2012/000778, PCT/AU2012/000787 and PCT/AU2014/000814 (owned by the present applicant) disclose a spectrally selective panel that may be used as a windowpane and that is largely transmissive for visible light, but diverts a portion of incident light to side portions of the panel where it is absorbed by photovoltaic elements to generate electricity. The disclosed panels are integrated with a window frame, which carries both the panels and the photovoltaic elements solar cells.

It is to be understood that, if any prior art publication is referred to herein, such reference does not constitute an admission that the publication forms a part of the common general knowledge in the art, in Australia or any other country.

SUMMARY

The disclosure provides a device for generating electricity, comprising:
- first and third panels that are each at least partially transmissive for visible light and are spaced apart from each other, the first panel defining a light receiving surface;
- first and second photovoltaic elements, the first photovoltaic element being arranged in a first orientation with respect to the light receiving surface and the second photovoltaic element being arranged in a second orientation that is different to both the orientation of the first photovoltaic element and the orientation of the light receiving surface, the first photovoltaic element and the second photovoltaic element being located within a projection of the circumference of the first panel in a direction along a surface normal of the first panel; and
- a support for supporting portions of the device, the support having a channel that is outwardly open at an edge portion of the device;

wherein the third panel, the first photovoltaic element and the second photovoltaic element are located within the projection of the circumference of the first panel in a direction along a surface normal of the first panel.

By providing the device with a support that is within projection of the circumference of the first panel in a direction along a surface normal of the first panel and that has a channel that is outwardly open at an edge portion of the device, it is possible to design the device so that it can be installed into a wide variety of window frames and/or into existing window frames already installed. The device may be designed such that it can replace a standard double or triple-glazed window in a standard window frame. For example, the device may replace a window pane in a traditional integrated glazing unit (IGU) with a traditional double or triple glazed window framing system.

The outwardly open channel may be continuous and may surround portions of the device, such as at least portions of the third panel and/or the first and/or second photovoltaic elements.

Each of the first, second and third panels may be transmissive for more than 80%, 70%, 50%, 30%, 20% or 10% of incident visible light.

The first orientation may be substantially parallel to the light receiving surface and the second orientation may be transverse to the light receiving surface. The third panel may have an end face that is transverse to the light receiving surface and a region near the end face that is substantially parallel to the light receiving surface. The first photovoltaic element may be adjacent the region near the end face and the second photovoltaic element may be adjacent the end face.

The third panel may an arrangement for re-directing light incident on the receiving surface in the at least one direction that is transversal to a surface normal of the first panel for collection by photovoltaic elements. The arrangement for redirecting light may comprise a diffraction grating and/or a luminescent material and/or a light scattering material.

The term "transverse" is to be interpreted broadly to mean any angle extending from a surface, for example includes angles ranging from approximately 5° to approximately 175° relative a planar surface.

Redirected light may in use be guided by total internal reflection within the third panel.

The third panel may comprise a plurality of panel portions. For example, the plurality of panel portions may be provided as a laminate layered structure comprising two or more panel portions. The arrangement to re-direct light may be positioned within or between two of the plurality of panel portions. The panel portions may mate with one another to form a stack where each of the panel portions are arranged substantially parallel to one another.

The support may comprise a first wall and a second wall opposite the first wall, the first and second walls may be arranged parallel to the light receiving surface. The support may also comprise a third wall and a fourth wall opposite the third wall. The third and fourth may be arranged transversely to the light receiving surface. The third and fourth walls may connect the first and second walls. A flange may extend parallel to the light receiving surface, for example from the third wall. The flange may be positioned proximate the third panel, but spaced therefrom. The channel may be defined by the first, second and fourth wall. The first photovoltaic element may be positioned on the flange and the second photovoltaic element may be positioned on the third wall.

The device may further comprise a third photovoltaic element which may be arranged in the first orientation substantially parallel to the light receiving surface. The third photovoltaic element may be positioned on or over the second wall of the support.

The photovoltaic elements may be of the same type or at least some of the photovoltaic elements may be of different types. For example, the photovoltaic elements may comprise different types of semiconductor material, such as one or more of Si, CdS, CdTe, GaAs, CIS or CIGS.

The device may be configured to fit into a standard window frame.

The disclosure also provides a window frame comprising the device as set forth above.

The disclosure further provides an integrated glass unit comprising the device as set forth above.

In addition, the disclosure also provides a system comprising a plurality of devices as set forth above and that are electrically connected. The devices may be connected in parallel.

The disclosure also provides a device for generating electricity, comprising:

first, second and third panels that are each at least partially transmissive for visible light, the first panel defining a light receiving surface, wherein the first and second panels are spaced apart from one another by a member so that a cavity is defined therebetween, the third panel being retained within the cavity by the member; and first and second photovoltaic elements positioned within the cavity, the first photovoltaic element being arranged in a first orientation with respect to the light receiving surface and the second photovoltaic element being arranged in a second orientation that is different to both the orientation of the first photovoltaic element and the orientation of the light receiving surface;

wherein the device is arranged to generate the electricity from at least a portion of light being in use received by the light receiving surface and to the first and/or second photovoltaic element.

BRIEF DESCRIPTION OF FIGURES

Embodiments will now be described by way of example only with reference to the accompanying non-limiting figures.

DETAILED DESCRIPTION OF EMBODIMENTS

Embodiments of the present invention generally relate to device for generating electricity. The device may be designed such that it can replace a standard double or triple-glazed window in a standard window frame. The device comprises first and third panels, which are parallel to each other and are spaced apart such that a cavity is formed between the first and third panels. The first and third panel are spaced apart by, and supported, by a support. The first and third that are largely transmissive for visible light. The first panel defining a light receiving surface. The device also comprises first and second photovoltaic elements. The first photovoltaic element is arranged in a first orientation with respect to the light receiving surface and the second photovoltaic element is arranged in a second orientation that is different to both the orientation of the first photovoltaic element and the orientation of the light receiving surface. The device is arranged to generate the electricity from at least a portion of light being in use received by the light receiving surface and to the first and/or second photovoltaic element. The third panel, the first photovoltaic element and the second photovoltaic element are located within a projection of the circumference of the first panel in a direction along a surface normal of the first panel. The first and third panels may form a double-glassed arrangement, which will be described in further detail below with reference to FIG. 2. Further, the device may comprise a third panel positioned such that the third pane is sandwiched between the first panel and the second panel. In this arrangement the first, second and second panels my form a triple-glassed arrangement, which will be described in further detail below with reference to FIG. 1.

The support is within projection of the circumference of, and at an edge of, the first panel in a direction along a surface normal of the first panel and has a channel that is outwardly open, continuous and surrounds portion of the device at an edge portion of the device.

Figure 1:
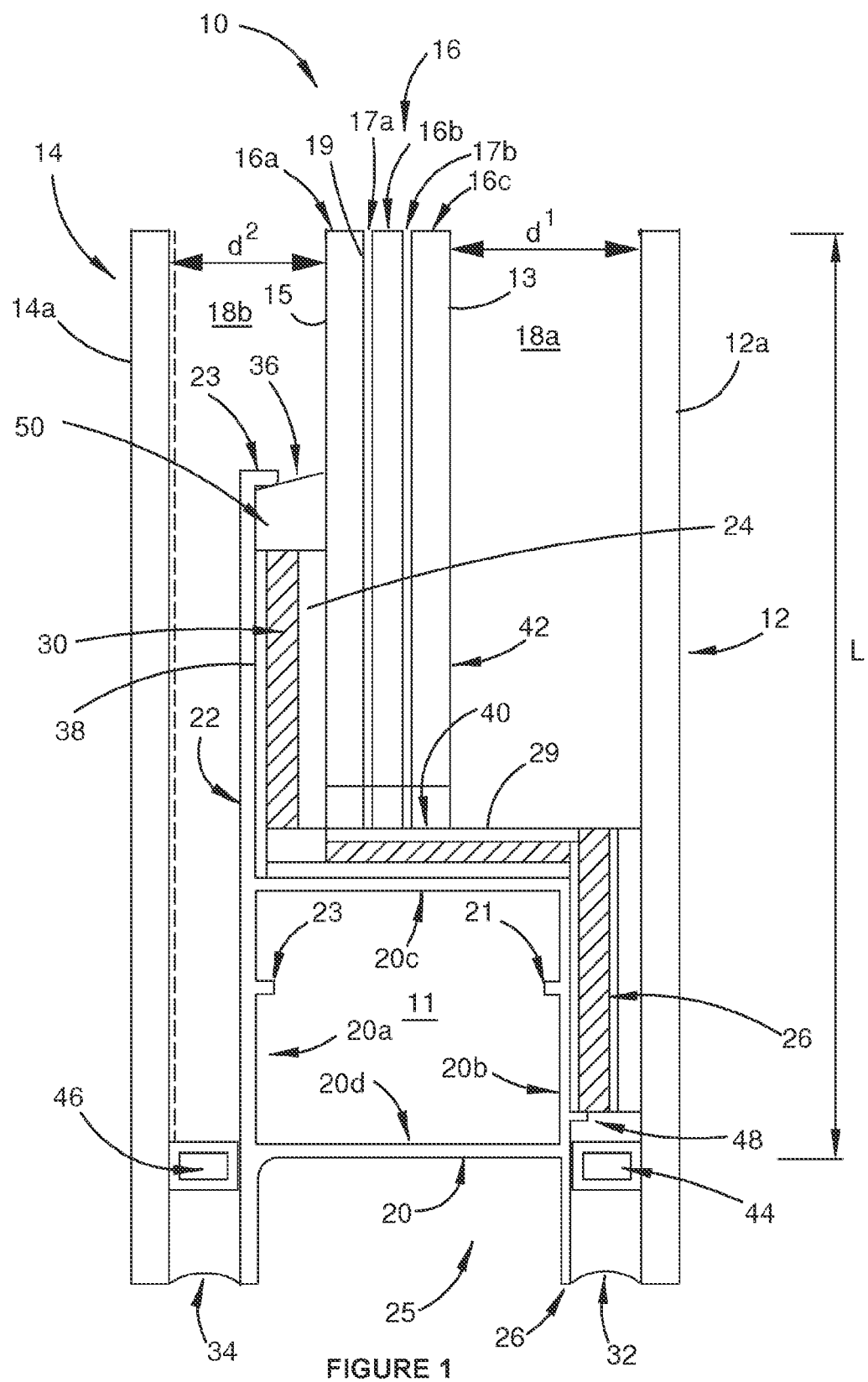
FIGS. 1 and 2 shows an embodiment of a device according to the disclosure.

Referring now initially to FIG. 1, a more specific embodiment of the present invention is described. FIG. 1 shows a device 10 for generating electricity. The device 10 may for example be provided in the form of a window pane structure (in this example triple-glazed) positioned within a (standard) window frame (not shown) of a building. A person skilled in the art will appreciate that the device 10 may be applied to different structures, such as walls and roof and the like.

Device 10 has first a second and in this specific embodiment also a third panel that are each largely transmissive for visible light and are provided in the form of first pane 12, second pane 16 and third pane 14, respectively. In an embodiment the first pane 12 is a low iron ultra-clear glass pane with a thickness of 4 mm, and the third pane 14 is low iron glass with a low-E coating having a thickness of 4 mm. The first pane 12 defines a planar light receiving surface 12a and in use is faces an outside environment e.g. is positioned on a structure facing the outside weather. The first pane 12 and the third pane 14 are spaced apart from one another by a support 20. The support 20 is within a projection of the first pane 12 in a direction of a surface normal of the first pane 12. The second pane 16 is positioned between the first 12 and the third panes 14 and retained by the support 20. The position of the second pane 16 defines a cavity 18a positioned between the first pane 12 and the second pane 16 and a second cavity 18b positioned between the third pane 14 and the second pane 16.

In the embodiment of FIG. 1 the second pane 16 is a laminate structure having three sub-panes 16a, 16b and 16c. Put another way, the second pane 16 comprises a plurality of pane portions. In an embodiment, sub-pane 16a is low iron ultra-clear glass having a thickness of 4 mm, and sub panes 16b and 16c are each a layer of ultra-clear glass having a thickness of 4 mm Each of the sub-panes 16a, 16b and 16c mate with each other to form a stack where each of the sub-panes are arranged approximately parallel to one another. Disbursed between sub-panes 16a and 16b is an interlayer 17a of polyvinyl butyral (PVB). A PVB interlayer 17b is located between sub-pane 16b and 16c, but PVB interlayer 17b also include a light scattering element in some embodiments. In some embodiments the light scattering element is a luminescent scattering powder comprising an epoxy that provides adhesive, luminescence and also light scattering functions. The second pane 16 may also include a diffraction grating that is arranged to facilitate redirection of light towards edge region of the third panel and guiding of the light by total internal reflection.

It should be appreciated that the second pane 16 could have any number of sub-panes with any number of interlayers. In some embodiments the second pane comprises a single piece of optically transmissive material such as glass. The second pane 16 has an end 40 that has a plane that is transverse to the light receiving surface 12a. In the embodiment of FIG. 1, edge 40 is approximately 90° relative to the planar light receiving surface 12a of the first pane 12. The second pane 16 also has an end region 42 extending substantially parallel to the light receiving surface 12a. End region 42 is a planar region of the second pane 16 near the end 40.

In an embodiment a distance from the light receiving surface 12a to an outer surface 14a of the third pane, that is a thickness of the device, is approximately 58 mm.

In the embodiment of FIG. 1 the support 20 is an extruded aluminium frame having a square tubular section defining a tubular cavity 11. Tubular cavity 11 is defined by a first wall 20a and second wall 20b that are parallel to one another and which are also substantially parallel to the light receiving surface 12a. The tubular cavity 11 also has third wall 20c and forth wall 20d that are parallel to one another and are transverse to the light receiving surface 12a. Third 20c and forth wall 20d are substantially parallel to end 40 of second pane 16. The forth wall 20d is set inboard from an outer face 26 of the device 10 to form a channel 25 that is defined by first 20a and second 20b walls. In the embodiment of FIG. 1, a spacing between the first 20a and second 20b walls is approximately 34 mm, and a spacing between third 20c and forth wall 20d is approximately 30 mm. However, a distance that the third 20c and forth 20d walls are spaced apart from one another may be determined by the required depth of the channel 25. The support 20 further comprises tab 21 extending from second wall 20b towards first wall 20a, and tab 23 extending from first wall 20a towards second wall 20b. The support 20 also has an outwardly open channel 25 that is surrounds the wall 20d of the support 20.

The support 20 has a flange 22 extending into the second cavity 18b in a direction substantially parallel to the light receiving surface 12a. In the embodiment of FIG. 1 the flange 22 is formed as a continuation of the first wall 20a. However, in some embodiments flange 22 extends from third wall 20c into the second cavity 18a. Generally, the flange is positioned relative to the second pane 16 on a side opposite the light receiving surface 12a. In some embodiments the flange 22 extends beyond the third wall 20c and into the cavity 18b by approximately 39 mm. In the embodiment of FIG. 1, the second pane 16 is spaced from the flange 22 by approximately 6 mm.

In the embodiment of FIG. 1 a first photovoltaic element 30 is sandwiched between the flange 22 and end region 42 of the second pane 16 at a first orientation that is approximately parallel to the light receiving surface 12a. A flexible PCB 38 is positioned between the first photovoltaic element 30 and the flange 22. A transmissive spacer in the form of cover 24 is positioned between the second pane 16 and first photovoltaic element 30 in some embodiments. In an embodiment the cover 24 has a thickness of approximately 3 mm. The first photovoltaic element 30 and cover 24 are held in place relative one another at an edge region of the second pane 16. The second pane 16 is secured to the flange 22 by adhesive portion 36. In an embodiment the adhesive portion is window silicone. To prevent the adhesive portion 36, the first photovoltaic element 30 and the cover 24 from sliding out of position, the flange 22 has a lip 23 that extends towards the second pane 16 thereby narrowing a cavity opening compared to a cavity formed between the flange 22 and the second pane 16. The lip 23 is not required in all embodiments. In an embodiment the first photovoltaic element 30 has a width of approximately 30 mm extending away from the third wall 20c along the flange 22.

A second photovoltaic element 28 is positioned on the third wall 20c so that a portion of the second photovoltaic element 28 is sandwiched between the end 40 of the second pane 16 and the third wall 20c. The second photovoltaic element 28 is oriented transversely to the light receiving surface 12a. In this way, the second photovoltaic element 28 is in a second orientation that is different to the first orientation of the first photovoltaic element 30. A width of the second photovoltaic element 28 extending in a direction from the first wall 20a to second wall 20b is dependent on a distance from the flange 22 to the second wall 20b. In an embodiment the second photovoltaic element 28 has a width of approximately 27 mm. In an embodiment the second photovoltaic element 28 has a silicone encapsulant e.g. layer 29. A flexible PCB is positioned between the second photovoltaic element 28 and the third wall 20c.

The embodiment of FIG. 1 also has a third photovoltaic element 26. However, the third photovoltaic element 26 is not required in all embodiments. The third photovoltaic element 26 is positioned on the second wall 20b between the support 20 and the first pane 12. In the embodiment of FIG. 1 an air gap is formed between the third photovoltaic element 26 and first pane 12. The use of an air gap helps to minimise conduction of heat. Therefore, in such embodiments, the device 10 may be arranged to form an integrated glass unit. To prevent movement of the third photovoltaic element 26 in a direction along a plane defined between the third 20c and forth 20d walls (i.e. along the plane defined by second wall 20b towards edge 26), a foot 48 extends from the second wall 20b towards the first pane 12. However, the foot 48 is not required in all embodiments and the third photovoltaic element 26 can be secured to the support 20 by adhesives. Like the second photovoltaic element 30, the third photovoltaic element 26 has a silicone encapsulant. A flexible PCB is positioned between the third photovoltaic element 26 and the second wall 20b. In some embodiments, a single flexible PCB is provided and is fixed to the flange 22, the third wall 20c and the second wall 20b in a continuous manner so that each of the first 30, second 28 and third 26 photovoltaic elements are in contact with the single flexible PCB. In an embodiment the third photovoltaic element 26 has a width of approximately 30 mm extending away from the foot 48 along the second wall 20b into the cavity 18.

In the particular embodiment of FIG. 1, each of the photovoltaic elements are of the same type. However, it should be appreciated that the photovoltaic elements may include elements that are of different types. For example, the photovoltaic elements may comprise different respective semiconductor materials, such as Si, CdS, CdTe, GaAs, CIS or CIGS or any other suitable semiconductor material.

The first pane 12 is connected to the support 20 by an adhesive portion 32. In some embodiments the adhesive portion 32 acts as a seal to prevent ingress of an outside environment into the cavity 18a. The adhesive portion 32 also helps to thermally insulate the support 20 from the first pane 12. In some embodiments the adhesive portion 32 is window silicone. Similarly, the third pane 14 is connected to the support by the adhesive portion 34 that in some embodiments acts as a seal to prevent ingress of an outside environment into cavity 18b. The adhesive portion 34 also helps to thermally insulate the support 20 from the third pane 14. In some embodiments the adhesive portion 34 is window silicones. When adhesive portions 32 and 34 form a seal, the cavity can be considered as being closed to an outside environment. To prevent condensation of any moisture that may be present in the cavities 18a and 18b, a desiccant 44 is positioned in the first cavity 18a proximate the adhesive portion 32, and a desiccant 46 is position in the second cavity 18b proximate the adhesion portion 34.

The support 20 with the continuous channel 25 surrounds portions of the device 10 and is generally shaped such that the device 10 may be positioned into a standard window frame providing a triple-glazing arrangement. The device may also be arranged to provide a double-glazing arrangement, which will be described below with reference to FIG. 2.

Figure 5:
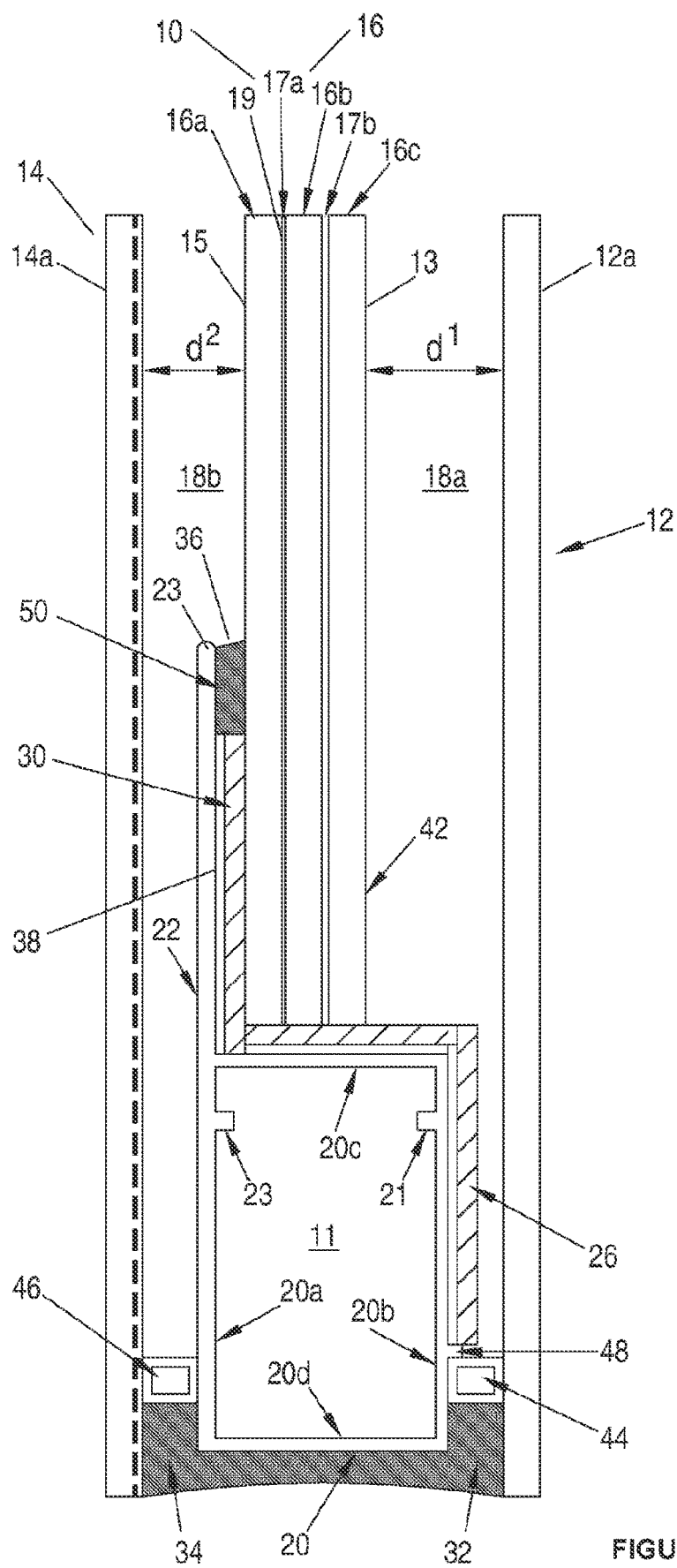
FIG. 5 shows an embodiment of a device according to the disclosure.

FIG. 5 shows a related embodiment of a device for generating electricity in accordance with an embodiment of the present invention. Like reference numerals were used for like components.

Figure 2:
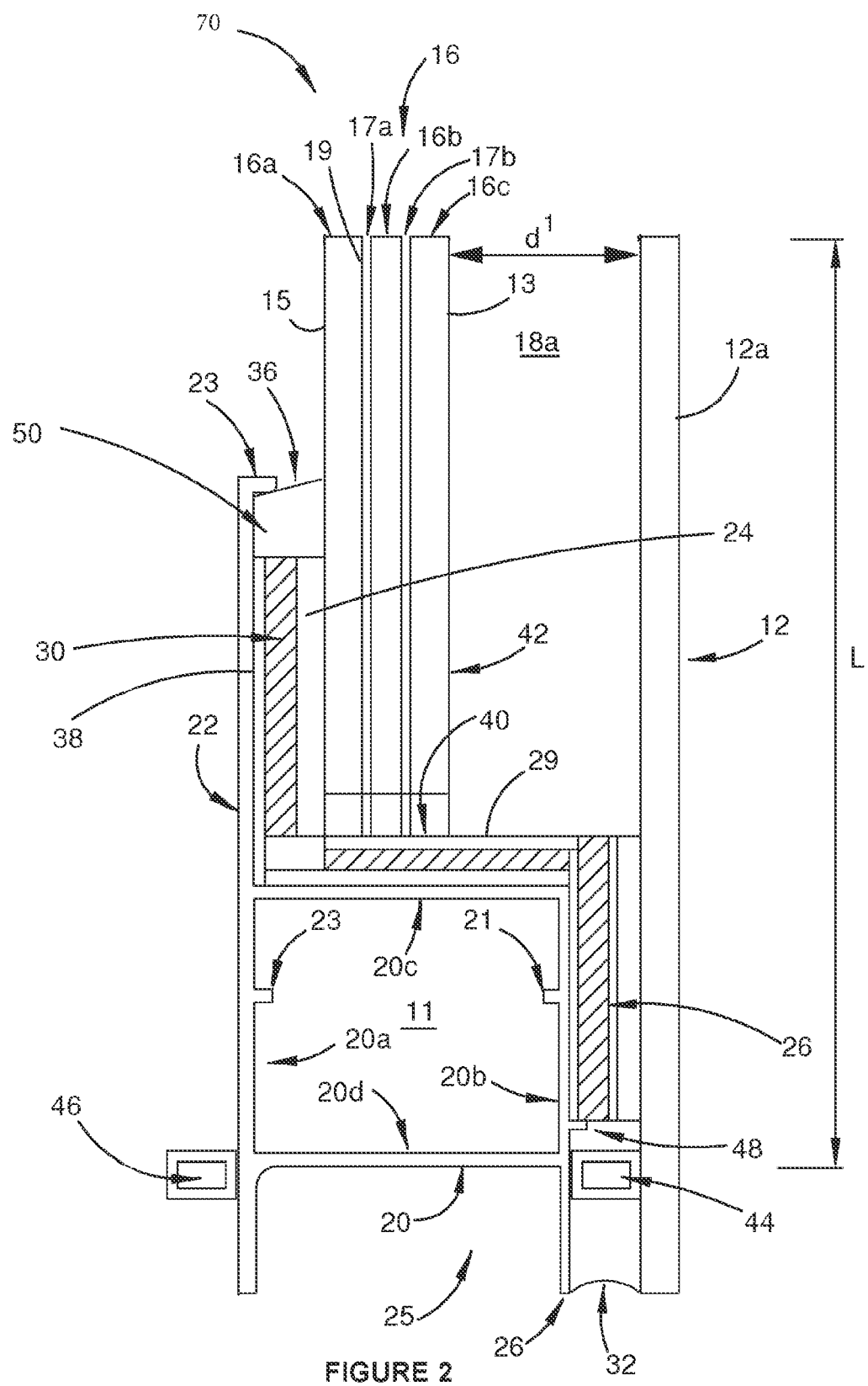

Referring now to FIG. 2 there is shown a device 70 for generating electricity. The device 70 is in this embodiment provided in the form of a double-glazing window arrangement. All components of the device 70 are also included in the device 10 described above with reference to FIG. 1 and were given the same reference numerals. However, in contrast to the device 10, the device 70 does not include a third panel, such as the third panel 14 shown in FIG. 1, as it forms a double-glazing arrangement.

Figure 3:
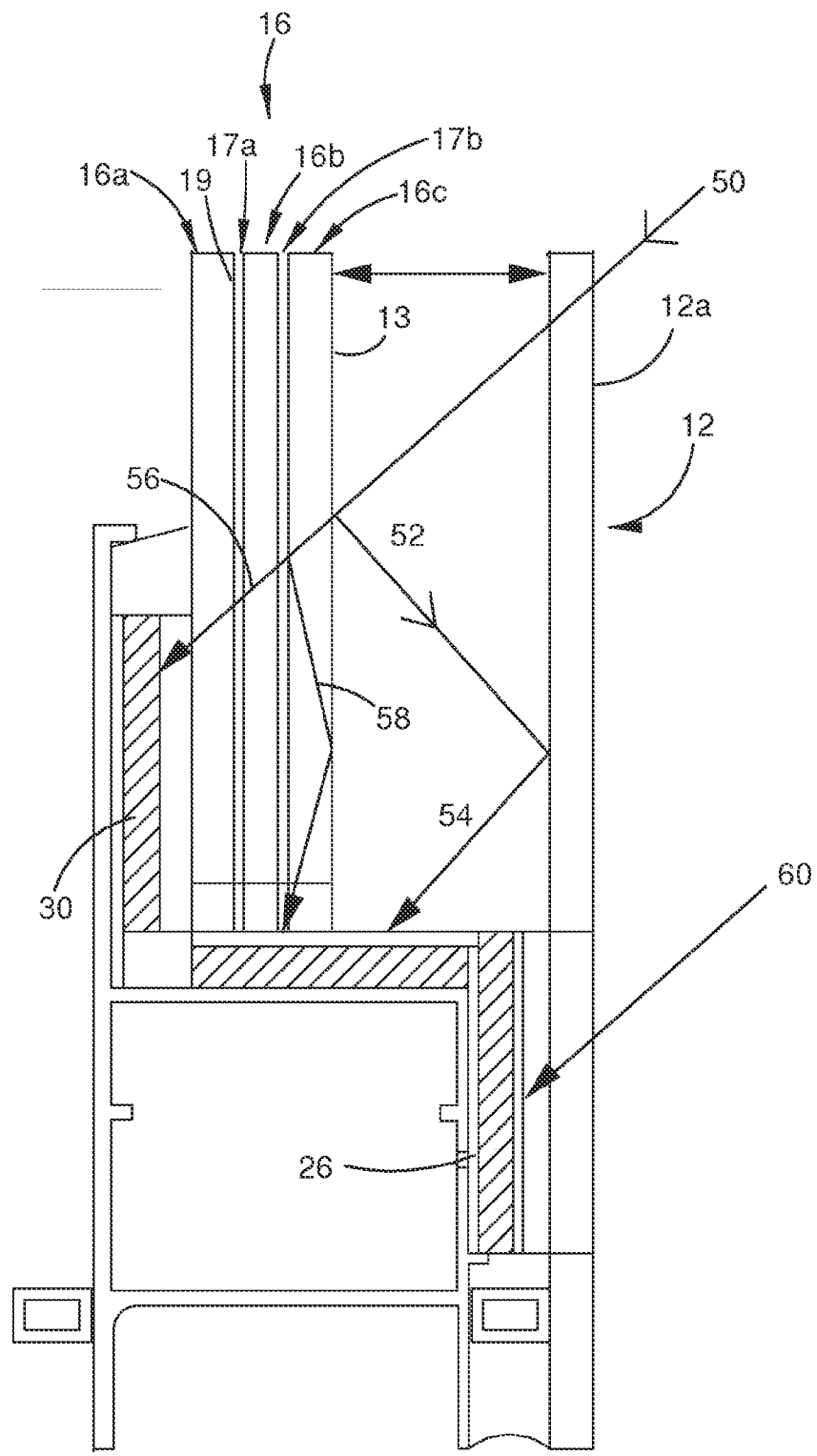
FIG. 3 shows an embodiment of a passage of light through the device of FIG. 2.

Use of the device 70 to generate electricity will now be described in more detailed with reference to FIG. 3. FIG. 3 shows the same features as FIG. 2, but some of the reference numbers are omitted for clarity. The use of device 100 to generate electricity may be similar to that described in WO2015/024046, the contents of which are incorporated in its entirety by reference.

Referring now to FIG. 3, when incoming light 50 passes through first pane 12 it enters cavity 18a before reaching a light receiving surface 13 of the second pane 16. A portion of the incoming light 50 is reflected off light receiving surface 13 as beam 52 where is further reflected off first pane as beam 54 before reaching second photovoltaic element 28. It should be appreciated that in addition to forming beam 52, incoming light 50 may only reflect off the light receiving surface 13 prior to reaching second photovoltaic element 28 and/or incoming light 50 reach the second photovoltaic element 28 without engaging with second pane 16. A portion of incoming light 50 may also travel through the second pane to engage with the luminescent scattering powder in interlayer 17b. A portion of the light that engages with the luminescent scattering powder is reflected or emitted in random directions as indicated by beam 58. Dependent on the orientation of the beam 58, light may then experience total internal reflection at interfaces of the third panel 16 towards end 40 before reaching the first photovoltaic element 30 or the second photovoltaic element 28. Although the embodiment of FIG. 32 only shows beam 58 generating near the end region 42, it may also be generated at a position distal from the end region 42, for example towards a centre point of a longitudinal length of the second pane 16. In particular for normal incidence of light on the light receiving surface, the scattering of incident or emission of luminescent light by the luminescent scattering powder increases a portion of the light that is directed towards edge 40 and thus second photovoltaic element 28.

In some embodiment the grating, luminescent material and/or the scattering material is arranged for spectrally deflecting of incident and reflected IR towards the edge region of the third panel 16 and for transmission of visible light.

In some embodiments a face 19 of sub-pane 16a that faces towards the first pane 12 is provided with diffracting layer, such as a layer of a diffraction grating element (not shown). The diffracting grating may be a transmission-mode blazed diffraction grating and is designed such that the majority of the incident solar (IR) light is deflected into a single preferential order of diffraction, with the grating design features optimized for the light incidence angle that is governed by the expected typical mid-day solar radiation incidence angle onto window surfaces. Spectral properties of the diffracting grating can be designed by those skilled in the art by adjusting the following parameters: refractive index, grating profile shape, blaze angle, duty cycle, grating period, number of phase levels and etching depth(s).

In some embodiments, the diffracting grating comprises a plurality of grooves, each groove having a distance in the range of 4 μm to an adjacent groove (grating period). The diffraction grating may be embossed into of one the surfaces of the panel 16, such as surface 17a or 17b. For further detailed about an arrangement for redirections light towards edge regions of the third panel reference is being made to PCT international applications numbers PCT/AU2012/000778, PCT/AU2012/000787 and PCT/AU2014/000814 (owned by the present applicant), and which are herewith incorporated by cross-reference.

The incoming light 50 can also pass directly through the second pane 16 and reach first photovoltaic element 30 as beam 56. Similarly, incoming light 60 passes through first pane 12 and contacts third photovoltaic element 26. It should be appreciated that the ratio of light received by each of the first 30, second 28 and third 26 photovoltaic element will be dependent on an angle the incoming light makes with the light receiving surface 12a.

The second pane 16 in some embodiments has a back coating on back face 15, Back face is opposite face 19. The coating may be a multilayer coating and arranged to reflect incident IR light within a wide IR wavelength band.

A front coating on face 13 on second panel 16 is provided in some embodiments. The front coating can have either the anti-reflective properties in the UV and visible wavelength ranges—in order to use as much incident UV energy within the panel structure as is available, and therefore excite a range of inorganic luminophores, or alternatively it can have high-reflection properties in the UV and also anti-reflection properties across the visible wavelength range and at the same time functions as a partial IR reflector. The visible-range antireflection properties can also be adjusted by design to minimize reflection of the incident light energy within a particular range of incidence angles. In another embodiment, the front coating on face 13 is arranged to be highly-reflective for the UV radiation whilst being antireflective for the visible light and optionally also highly-reflective within an IR wavelength (sub)-band within which the luminophore materials emit light. The high-reflectivity property in the UV band is in this example used to protect the luminophores from being adversely affected by the incident UV radiation.

It should be appreciated that the terms "front" and "back" are relative to the light receiving surface and the orientation of the device relative to an outside environment and do not limit the device to any specific orientation.

The multi-layered structure of the second pane 16 may also have also a UV and IR reflective back coating. The back coating on rear face 15 of the panel 16 is a multi-layered structure that is formed from metallic and dielectric materials. Alternatively, the multilayered structures may be formed exclusively form dielectric materials.

A combination of the front coating on face 13, back coating of face 15, light scattering material, the luminescent material and the diffraction grating helps to direct incoming light towards at least a portion of the first 30 and/or second 28 photovoltaic element, and this can help to increase the intensity of light received by the first 30 and/or second 28 photovoltaic element which can help to increase the amount of electricity generated by the photovoltaic elements and thus the device 10. Such features make the third panel 16 a spectrally selective panel since specific wavelengths of light may be adsorbed, scattered and diffracted by second pane 16.

Figure 4:
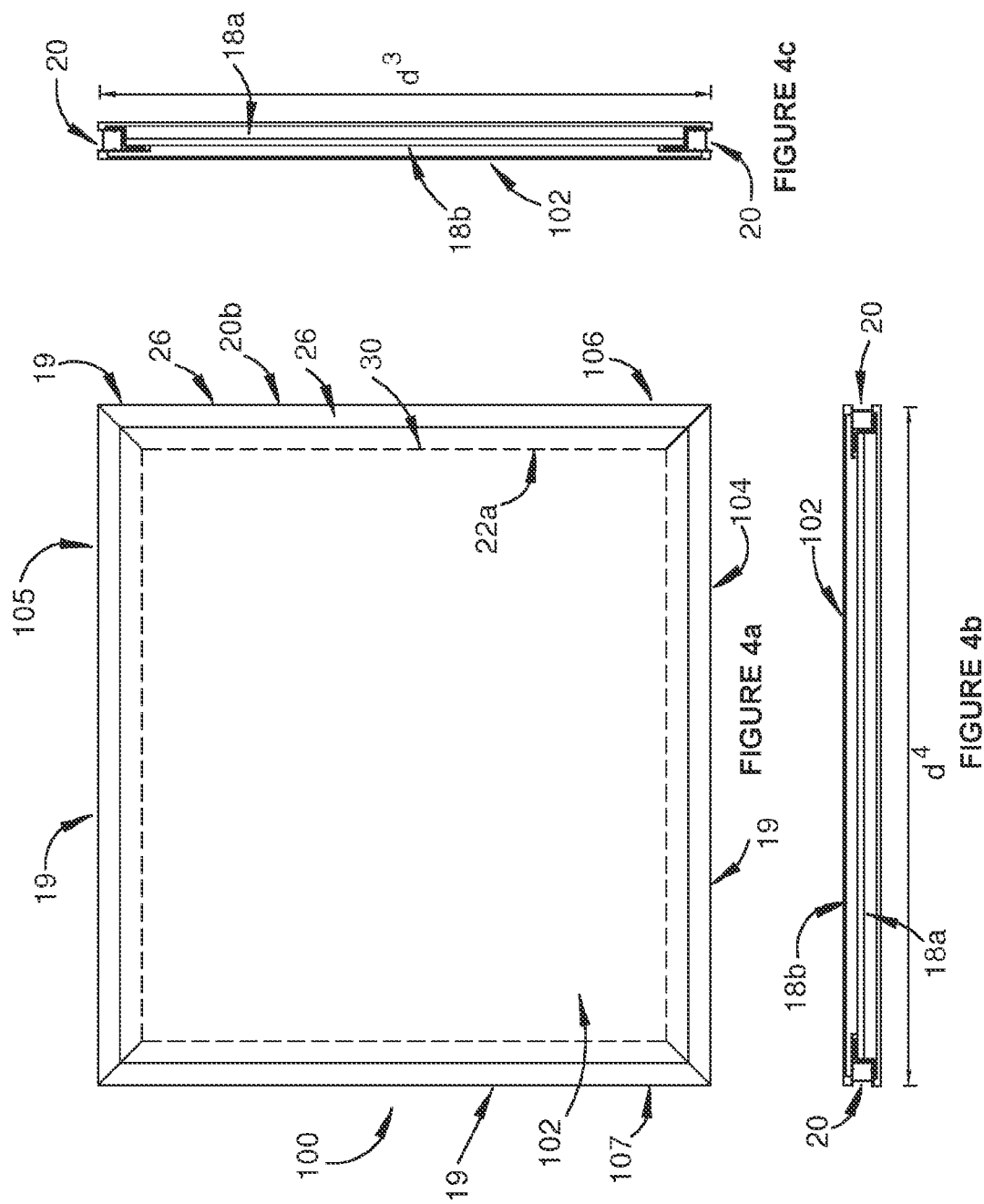
FIG. 4a shows a front view of an embodiment of a window comprising an embodiment of the device.
FIG. 4b shows an end view of the window comprising an embodiment of the device.
FIG. 4c shows a side view of the window comprising an embodiment of the device.

FIG. 4 shows a device 100 forming a window element 102 arranged to fit into a window frame. The support 20 extends around a perimeter of the window element 102. FIG. 4 shows a view towards the first pane 12 at an angle transverse to the plane defined by the light receiving surface 12a. The end of the flange 22 is depicted by dashed line 22a. The first photovoltaic element 30 is positioned proximate end of flange 22a, and the third photovoltaic element 26 is positioned on the second wall 20b proximate the end 26 of support 20. FIG. 4b shows a cross-sectional view of device 100 extending along a line extending from side 106 to 107.

FIG. 4c shows a cross-sectional view of window element 100 extending along a line extending from side 104 to 105. In the embodiment of FIG. 4b a width ($d^4$) of the element 100 is 1087 mm and a height ($d^3$; see FIG. 4b) is 1200 mm. However, the height and width of the device 100 varies depending on the required size of window element 102 and in principle the element 100 can have any size.

It will be understood to persons skilled in the art of the invention that many modifications may be made without departing from the spirit and scope of the invention.

In the claims which follow and in the preceding description, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments.

The invention claimed is:

1. A device for generating electricity, comprising:
   first and third panels that are each at least partially transmissive for visible light and are spaced apart from each other, the first panel defining a light receiving surface, the third panel having an end face that is substantially transverse to the light receiving surface and a region near the end face that is substantially parallel to the light receiving surface;
   first and second photovoltaic elements, the first photovoltaic element being arranged in a first orientation with respect to the light receiving surface and the second photovoltaic element being arranged in a second orientation that is different to both the orientation of the first photovoltaic element and the orientation of the light receiving surface, the first photovoltaic element and the second photovoltaic element being located within a projection of a circumference of the first panel in a direction along a surface normal of the first panel; and
   a support for supporting portions of the device, the support being structured such that the device has a channel that is outwardly open at an edge portion of the device and that is continuous, the support supporting the first and third panels;
   wherein the third panel, the first photovoltaic element and, the second photovoltaic element, and the support are located entirely within the projection of the circumference of the first panel in a direction along a surface normal of the first panel,
   wherein the first orientation is substantially parallel to the light receiving surface and the second orientation is substantially transverse to the light receiving surface, and
   wherein the first photovoltaic element is positioned in spaced relation with the first panel and adjacent the region near the end face of the third panel, and the second photovoltaic element is positioned adjacent the end face, and
   wherein the third panel is positioned between the first photovoltaic element and the light receiving surface, and
   wherein the third panel is positioned relative to the support so that a projection of a portion of the end face of the third panel in a direction aligned substantially with the first orientation projects within the outwardly open channel.

2. The device of claim 1, wherein the support surrounds the third panel at an edge of the first panel.

3. The device of claim 1, wherein the support surrounds at least a portion of the first and second photovoltaic elements.

4. The device of claim 1, wherein the third panel comprises an arrangement for re-directing light incident on the light receiving surface in at least one direction that is transversal to a surface normal of the first panel for collection by photovoltaic elements.

5. The device of claim 4, wherein the arrangement for redirecting light comprises a diffraction grating and/or a luminescent material and/or a light scattering material.

6. The device of claim 4, wherein in use the redirected light is guided by total internal reflection through the third panel.

7. The device of claim 5, wherein the third panel comprises a plurality of panel portions and wherein the diffraction grating and/or light scattering element and/or the luminescent material are positioned within or between panel portions.

8. The device of claim 7, wherein the plurality of panel portions of the third panel mate with one another to form a stack in which each of the panel portions are arranged substantially parallel to one another.

9. The device of claim 1, wherein the third panel comprises a plurality of panel portions.

10. The device of claim 9, wherein the plurality of panel portions of the third panel mate with one another to form a stack in which each of the panel portions are arranged substantially parallel to one another.

11. The device of claim 1, wherein a transparent spacer is provided between the first photovoltaic element and the third panel.

12. The device of claim 1, wherein the support comprises:
   a first wall and a second wall opposite the first wall, the first and second walls being arranged parallel to the light receiving surface;
   a third wall and a fourth wall opposite the third wall, the third and fourth being arranged transversely to the light receiving surface, the third and fourth walls connecting the first and second walls; and
   a flange extending over an edge portion of the third panel in a direction parallel to the light receiving surface.

13. The device of claim 12, wherein the first photovoltaic element is positioned between the flange and the third panel and the second photovoltaic element is positioned between the edge portion of the third panel and the third wall.

14. The device of claim 13, comprising a third photovoltaic element arranged in the first orientation and positioned between the support and the first panel at or near an edge of the first panel, wherein the third photovoltaic element is positioned on the second wall.

15. The device of claim 1, comprising a third photovoltaic element arranged in the first orientation and positioned between the support and the first panel at or near an edge of the first panel.

16. The device of claim 1, configured to fit into a standard window frame.

17. The device of claim 1, wherein an adhesive portion is positioned within a cavity.

18. A system comprising a plurality of devices in accordance with claim 1 that are electrically connected.

* * * * *